United States Patent [19]

Quick et al.

[11] Patent Number: 5,465,899
[45] Date of Patent: Nov. 14, 1995

[54] METHOD AND APPARATUS FOR FINE PITCH WIRE BONDING USING A SHAVED CAPILLARY

[75] Inventors: Roderick L. Quick, DeSoto; John W. Orcutt, Richardson, both of Tex.

[73] Assignee: Texas Instruments Incorporated, Dallas, Tex.

[21] Appl. No.: 323,329

[22] Filed: Oct. 14, 1994

[51] Int. Cl.$^6$ .................................................. H01L 21/603
[52] U.S. Cl. ...................... 228/180.5; 228/4.5; 228/49.5
[58] Field of Search ............................ 228/110.1, 180.5, 228/1.1, 4.5, 49.5; 156/73.2; 219/56.21, 56.22

[56] References Cited

U.S. PATENT DOCUMENTS 5,269,452  12/1993  Sterczyk .................................. 228/49.2

FOREIGN PATENT DOCUMENTS 87842  5/1993  Japan ...................................... 228/4.5

Primary Examiner—Samuel M. Heinrich
Attorney, Agent, or Firm—W. James Brady, III; Richard L. Donalson

[57] ABSTRACT

An wire bonding apparatus for forming ball and stitch bonds includes a bond head (42) having a shaved capillary (20), a carrier (43) for holding the bond head (42), a bearing (44) on which the carrier (43) is mounted, and a bearing table (46) on which the bearing (44) is mounted. The bearing table (46) and bearing (44) provide rotary movement about a z axis for the capillary (20). An x-y table (48) on which the carrier bearing table (46) is mounted provides movement in x and y directions for the capillary (20). A fixed work holder (50) supports a semiconductor die (11) and a leadframe (52) adjacent the capillary (20). The relative rotation provided between shaved capillary (20) and work holder (50) provides proper orientation of the capillary (20) with respect to leadframe (52) to form high quality stitch bonds on leadframe (52) while permitting fine pitch ball bonds to be formed on the semiconductor die (11).

19 Claims, 6 Drawing Sheets

METHOD AND APPARATUS FOR FINE PITCH WIRE BONDING USING A SHAVED CAPILLARY

BACKGROUND OF THE INVENTION

1. Field of the Invention

This invention relates to wire bonding of semiconductor devices and, more particularly, to a method and apparatus for fine pitch wire bonding using a shaved capillary.

2. Brief Description of the Prior Art

Ball bonding is a widely used technique in semiconductor fabrication to connect the internal semiconductor die to the external leads. In this procedure, a fine gold wire, usually about 25 µm (0.0010 inch) in diameter, is fed down through a ceramic capillary, generally alumina, having an entry aperture at the top and an exit aperture at the opposite end of a bore therein. A ball is formed external to the exit aperture by an electronic flame off (EFO) mechanism that melts a small portion of the wire remaining after the previous bond. Essentially, the ball is formed at the end of the wire by an electric discharge spark. At this time, the capillary is relatively far from the ball (millimeters distant). The wire is restrained from moving by a tensioner until the ball is centered in the chamfer diameter of the capillary and is forced downward by the continued motion of the capillary toward the bond pad on the die. The ball is placed on a bond pad of the semiconductor device being assembled and the capillary end then forces the ball against the pad to provide the bond in conjunction with thermosonic energy.

The above described ball bonding step presents a major obstacle to gold wire ball bonding in integrated circuits with the bond pads closer than approximately 100 µm (0.0039 inch) due to the diameter of the capillary. As the pad-to-pad pitch of semiconductor devices decreases, there is less room for the capillary to make a ball and bond the ball and attached wire to a pad without interfering with the ball and wire on an adjacent pad. Current fine-pitch gold ball bonding uses a fine pitch or "bottlenose" capillary. However, it is not possible to shrink the capillary diameter sufficiently to produce bond pitches below approximately 90 µm (0.0035 inch) without causing stitch bond strength degradation. The reason for this stitch bond strength degradation is that the dimensions of the face of the capillary that forms the stitch bond shrink as the capillary diameter shrinks, thereby reducing the area in which the stitch is formed. Also, great stress is placed on the capillary bond face during the stitch bond. The capillary bond tip is literally forced into the leadframe, leaving an imprint of the capillary tip in the lead finger, thereby presenting the same problem as discussed above with regard to the ball bond. Additionally, capillary cost increases due to reduced manufacturing yields and capillary life is reduced because the capillary with reduced diameter is more fragile than a standard capillary.

A capillary that has had two parallel cuts made to its sides for ball to ball clearance is sometimes used to ball bond very fine pitch semiconductor die. Such a capillary is usually referred to as a "shaved" capillary. Since the parallel cuts remove the face portion of the capillary that makes the stitch bond on either side of the capillary, such a shaved capillary can only be used to bond wires that are more or less directly perpendicular to the die to keep the wire under the remaining face of the capillary for proper stitch bond. This limits the use of a shaved capillary to either all x or all y direction wires with little or no wire angle to the side of the semiconductor die or between a set of wires. The wires for such a capillary have to be substantially parallel as a set which drastically limits the usefulness of such a capillary design. However, the remaining face of such a shaved capillary is much larger than the face of a capillary that can bond in all directions at the same pad-to-pad pitch, and this larger capillary face allows the shaved capillary to make very good stitch bonds, compared to stitch bonds made with a same pad-to-pad pitch, all-direction capillary.

Wedge bonding is another widely used technique in semiconductor fabrication to connect the internal semiconductor die to the external leads. Here, aluminum wire is usually used, but gold wire is an option. Wire sizes are similar to those used in ball bonding. The bonding tool and process is quite different. The wire is fed under a metal bonding tool that makes a "stitch" bond, by pressing a small portion of the wire to the semiconductor's bond pad. The tool is then moved in z and x-y directions to loop the wire to the external lead and make a second stitch bond on the lead. The tool can only pull wire and wires are normally bonded in the y direction of the bond head. Either the part or the bond head has to be rotated to align each bond pad and external lead to the tool path in the y table direction.

The resultant stitch bond is rectangular in shape, with the thin dimension being in the x direction of the resultant bond. Bonds made perpendicular to the direction of the bond pads can make very tight pitch with the external leads and this causes the resultant stitch bond to rotate on its bond pad, increasing the pad to pad pitch required for proper clearance.

It is therefore apparent that an improved technique for making wire bonds to pads of semiconductor devices will be increasingly desirable as the dimensions and spacing of the bond pads shrink.

SUMMARY OF THE INVENTION

Generally, and in one form of the invention, a method for wire bonding uses a capillary having a bore and first and second opposed side walls and third and fourth opposed side walls, the third and fourth side walls being curved and spaced apart by a longitudinal dimension along a first axis through the bore, the first and second side walls spaced apart by a lateral dimension along a second axis through the bore perpendicular to the first axis, the lateral dimension being less than the longitudinal dimension. The method includes the steps of: forming a ball bond with a first end of a wire on a first surface at a first location with the capillary; moving the capillary to a second surface at a second location so that the wire extends from the first location to the second location; performing relative rotation of the capillary with respect to the second surface so that the wire extends from beneath one of the third and fourth side walls; and forming a stitch bond on the second surface at the second location.

In another form of the invention, a wire bonding apparatus for forming ball bonds and stitch bonds, includes: a bond head including a capillary having a bore and first and second opposed side walls and third and fourth opposed side walls, the third and fourth side walls being curved and spaced apart by a longitudinal dimension along a first axis through the bore, the first and second side walls spaced apart by a lateral dimension along a second axis through the bore perpendicular to the first axis, the lateral dimension being less than the longitudinal dimension; a work holder for supporting a semiconductor die and a leadframe adjacent the capillary; and, means for providing relative rotation about a z axis between the capillary and the work holder.

It is an advantage of the invention that fine pitch wire bonding with high quality, reliable stitch bonds can be performed on a semiconductor die and leadframe leads requiring numerous, different bonding angles in a single operation.

BRIEF DESCRIPTION OF THE DRAWINGS

Corresponding numerals and symbols in the different figures refer to corresponding parts unless otherwise indicated.

DESCRIPTION OF THE PREFERRED EMBODIMENT

Figure 1:
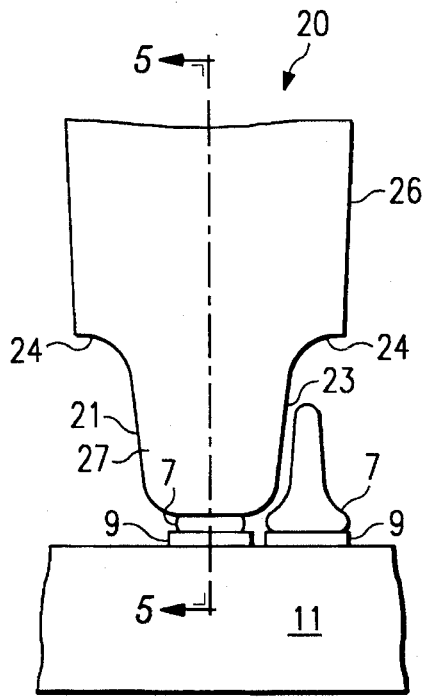
FIG. 1 is a front view of the tip portion of a prior art shaved capillary.
Figure 2:
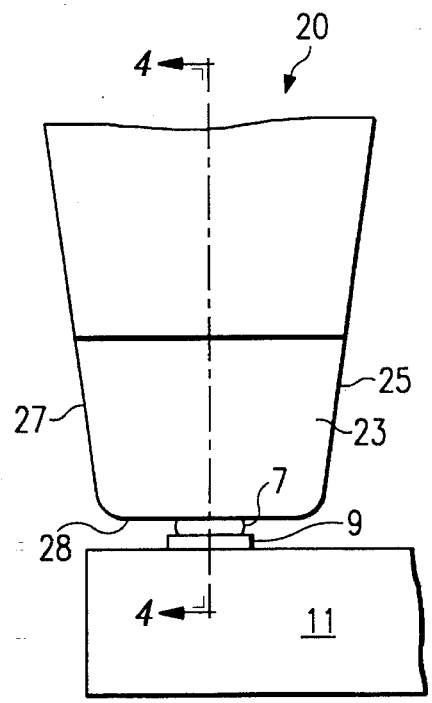
FIG. 2 is a side view of the tip portion of the shaved capillary of FIG. 1.

FIGS. 1 and 2 show front and side views, respectively, of a tip portion of a shaved capillary 20 according to the prior art forming ball bonds 7 on bond pads 9 of a semiconductor die 11. Shaved capillary 20 has opposing planar lower side walls 21 and 23, that are formed by shaving or making parallel cuts in the end of capillary 20 adjacent face 28, and opposing curved lower side walls 25 and 27. Although planar side walls 21 and 23 are shown as substantially parallel in FIG. 1, they may be formed at an angle to one another. Prior to shaving, capillary 20 has a circular cross-section adjacent face 28. The cuts may be made using a grinder or laser, for example, and result in the distance between planar side walls 21 and 23 being less than the distance between curved lower side walls 25 and 27. Lower side walls 21 and 23 are connected to circular upper side wall 26 by sloped walls 24.

Figure 3:
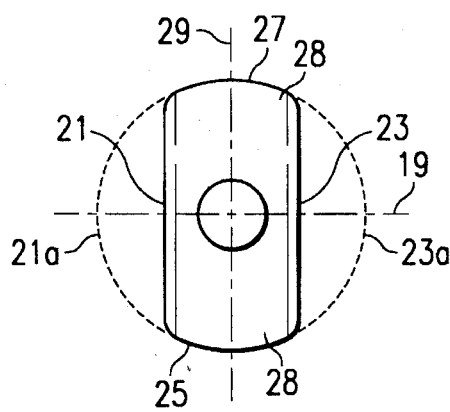
FIG. 3 is a bottom view of the tip portion of the shaved capillary of FIG. 1.

FIG. 3 is a bottom view of shaved capillary 20 in which walls 24 and 26 are omitted for clarity. Curved lower side walls 21a and 23a, shown in phantom, exist prior to shaving. As seen in FIG. 3, face 28 has a longitudinal dimension extending from side wall 25 to side wall 27 along axis 29 that is greater that the lateral dimension extending from side wall 21 to side wall 23 along an axis 19 perpendicular to axis 29. The longitudinal distance along axis 29 in unchanged as a result of shaving. The reduced distance between side walls 21 and 23 allows fine pitch bonding thus permitting the distance between bond pads 9 to be reduced as seen in FIG. 1.

Figure 4:
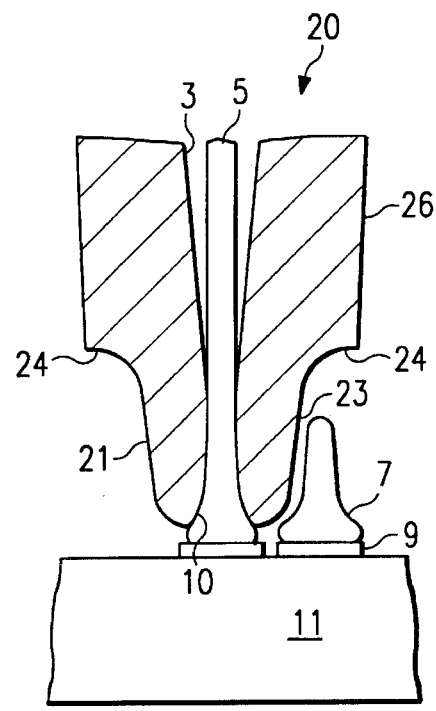
FIG. 4 is a cross-sectional view of the tip portion of the shaved capillary of FIG. 2 taken along section lines 4—4.
Figure 5:
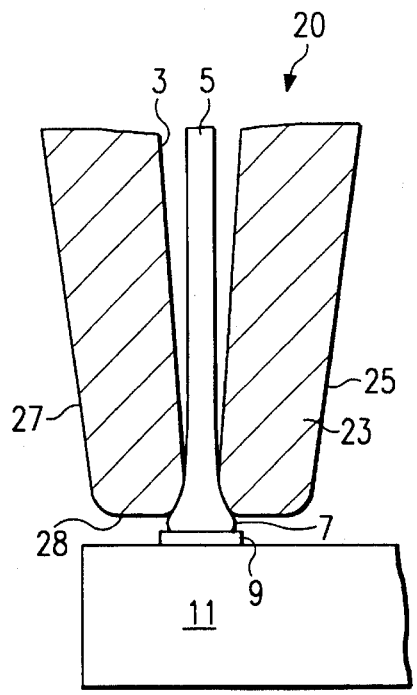
FIG. 5 is a cross-sectional view of the tip portion of the shaved capillary of FIG. 1 taken along section lines 5—5.

FIGS. 4 and 5 are cross-section views taken along section lines 4—4 of FIG. 2 and 5—5 of FIG. 1, respectively. As seen in FIGS. 4 and 5, shaved capillary 20 has a central bore 3 in which a gold wire 5 is disposed. A ball 7 is disposed in chamfer 9 at the bottom of bore 3.

Figure 6:
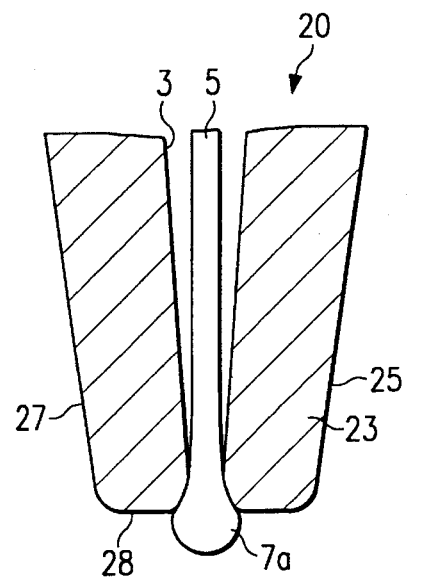
FIGS. 6–8 show successive steps in the formation of a ball bond and stitch bond using the shaved capillary of FIG. 1.
Figure 6:
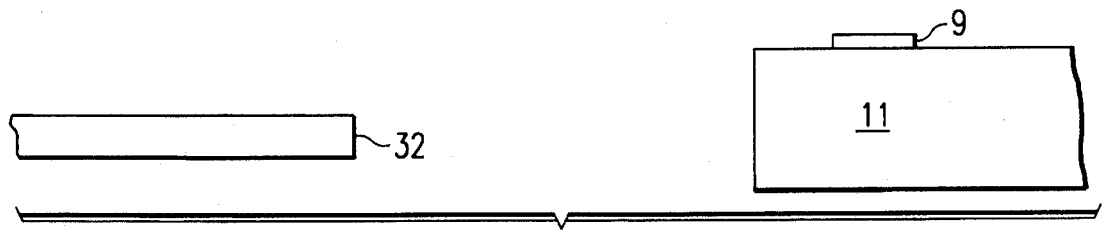
Figure 7:
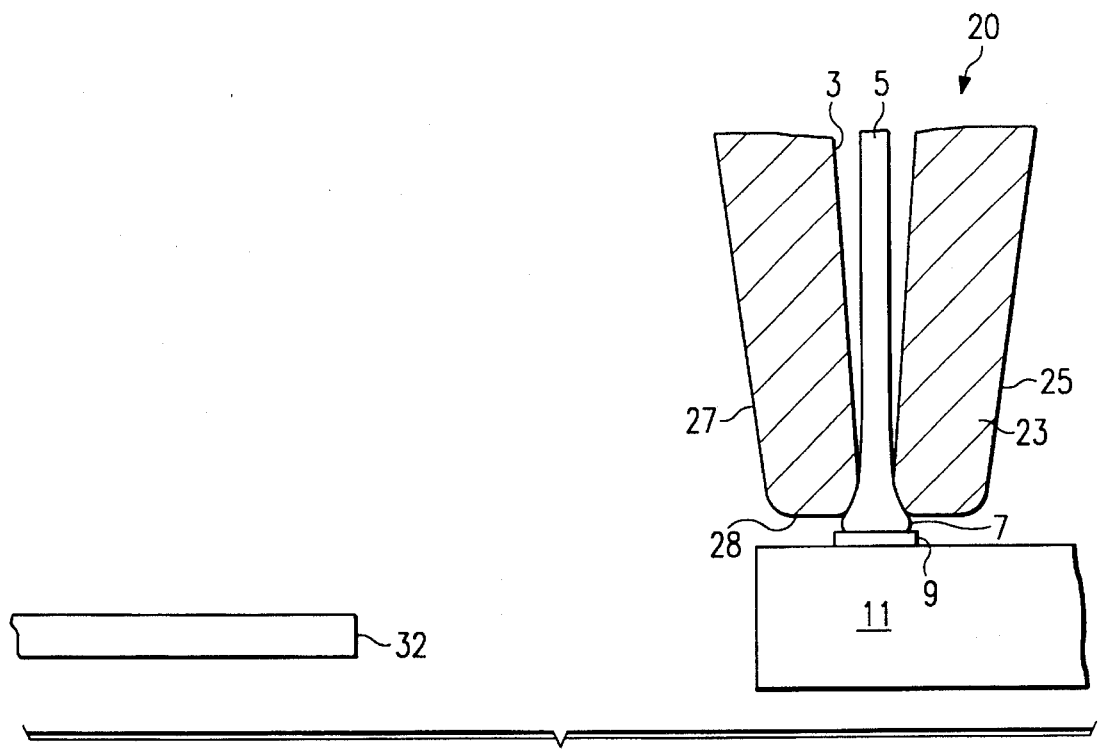
Figure 8:
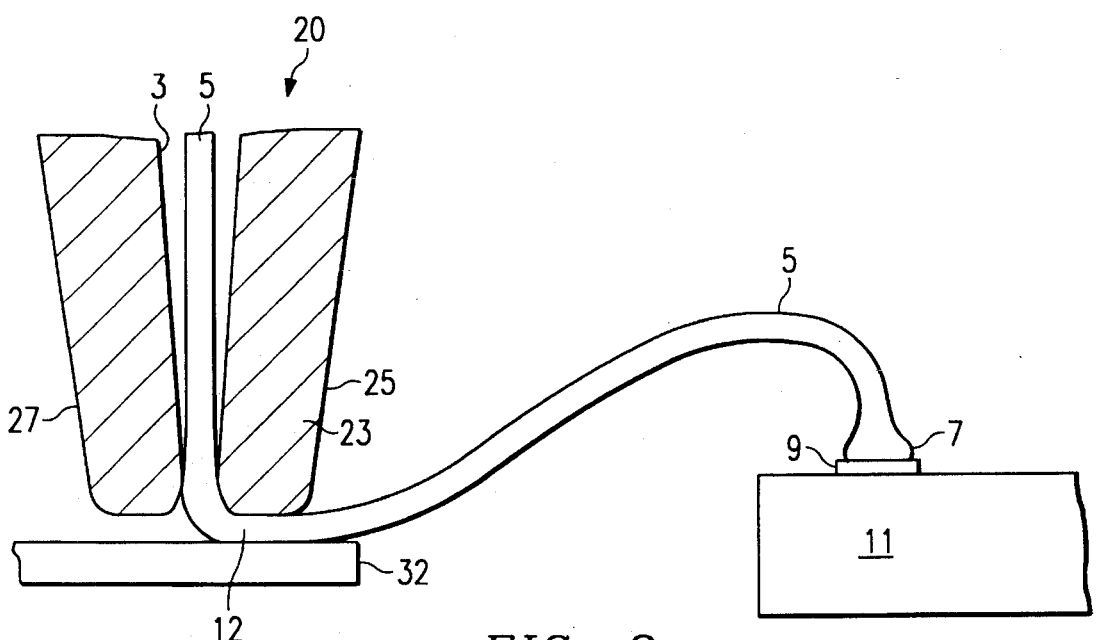
Figure 8A:
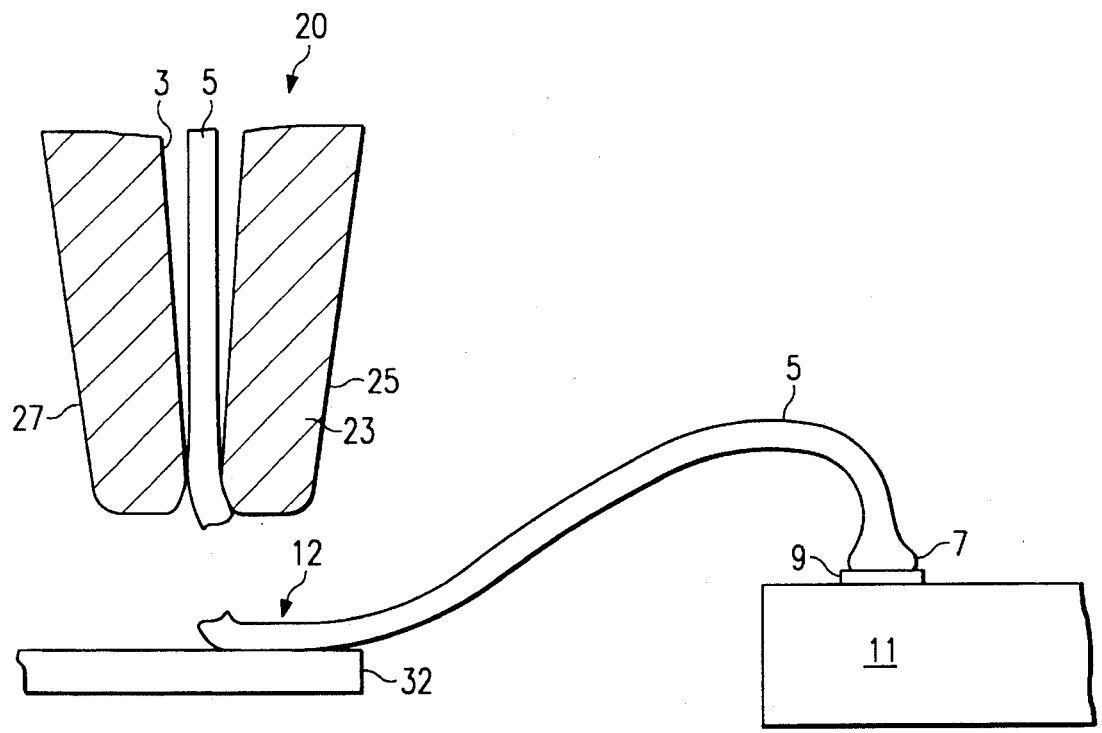

FIGS. 6–8a show successive steps in the formation of a ball bond 7 on bond pad 9 of die 11 and a stitch bond 12 on a lead 32 using the shaved capillary of FIG. 1. As seen in FIG. 6, capillary 20 is initially spaced from bond pad 9 and a ball 7a is formed external by conventional electronic flame off (EFO) techniques that melts a small portion of the wire remaining after the previous bond. Subsequently ball 7a is bonded to bond pad 9 by lowering capillary 20 to place ball 7 against bond pad 9 of die 11 and applying an ultrasonic pulse and pressure from the tip of capillary 20 impinging on the ball to cause ball 7 to be flattened against and bond to the bond pad 9 as shown in FIG. 7. The capillary 20 is then lifted away from the bond pad 9 and travels to the next wire bonding position over lead 32. A stitch bond 12 is made by lowering capillary 20 to place wire 5 against lead 32 and applying an ultrasonic pulse and pressure from the tip of capillary 20 impinging on wire 5 to cause wire 5 to be flattened against and bond to lead 32 as shown in FIG. 8. The capillary 20 is then lifted away from lead 32 and wire 5 broken leaving stitch bond 12 intact as shown in FIG. 8a.

Figure 9:
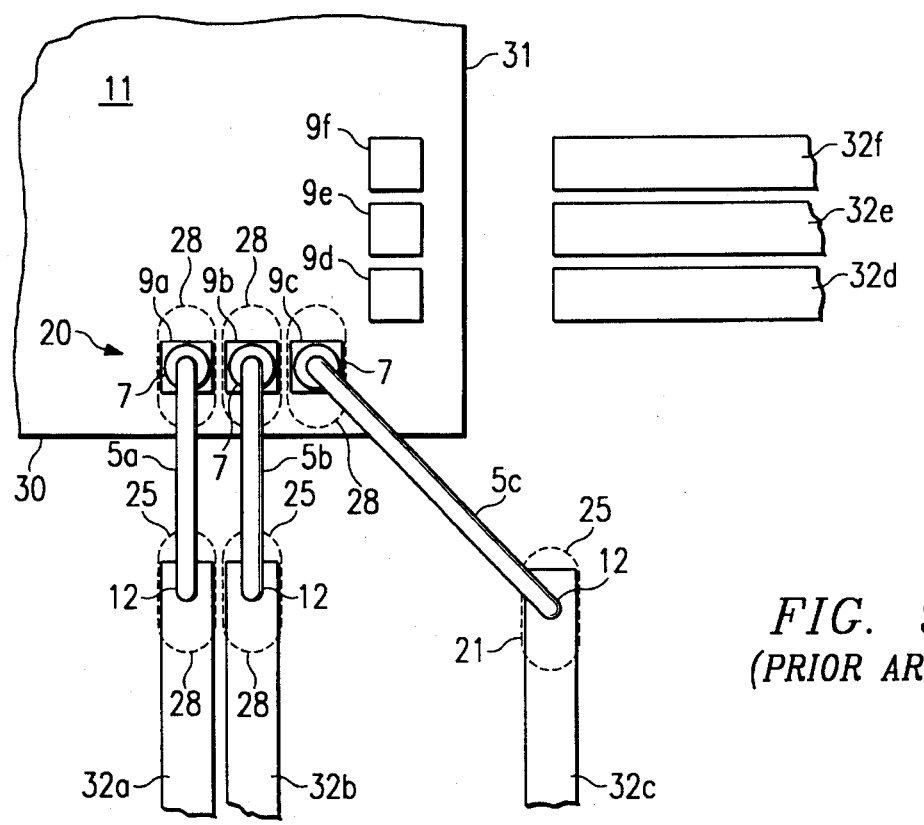
FIG. 9 shows a die wire bonded to leads using the shaved capillary of FIG. 1 in a wire bonding apparatus according to the prior art.

Shaved capillary bonding equipment according to the prior art maintains a fixed orientation between the semiconductor die and leads and the shaved capillary. As a result, the wires being bonded must extend substantially perpendicular to the die edge so that sufficient capillary face area is maintained over the wire for proper stitch bonding. FIG. 9 illustrates the drawbacks of the fixed orientation between the die, leads, and shaved capillary in prior art bonding equipment.

As seen in FIG. 9, die 11 has a plurality of bond pads 9a–9c adjacent side 30 of die 11 and bond pads 9d–9f adjacent side 31 of die 11. A plurality of leadframe leads 32a–32c are spaced from side 30 of die 11 and leadframe leads 32d–32f are spaced from side 31 of die 11. In prior art bonding equipment, capillary 20 is capable of movement in the x and y directions and in a z direction perpendicular to the plane containing the x and y axes but is incapable of rotation about the z axis. Capillary 20 initially forms a ball bond 7 on bond pad 9a and is moved in the z and y directions to form a stitch bond 12 on lead 32a. Wire 5a is thus bonded to bond pad 9a and lead 32a and, since lead 32a is directly below bond pad 9a in the y direction, wire 5a is substantially perpendicular to side 30 of die 11. The bond angle for the stitch bond on lead 32a is approximately 90 degrees. Capillary 20 is then moved in the z and x directions to form a ball bond 7 on bond pad 9b followed by movement in the z and y directions to form a stitch bond 12 on lead 32b. Wire 5b is thus bonded to bond pad 9b and lead 32b and, since lead 32b is directly below bond pad 9b in the y direction, wire 5b is substantially perpendicular to side 30 of die 11. The bond angle for the stitch bond on lead 32b is also approximately 90 degrees. Capillary 20 is then moved in the z and x directions to form a ball bond 7 on bond pad 9c followed by movement in the z, x and y directions to form a stitch bond 12 on lead 32b. Wire 5c is thus bonded to bond pad 9c and lead 32c and, since lead 32c is not directly below bond pad 9c in the y direction, wire 5c is at an acute angle with respect to side 30 of die. The bond angle for the stitch bond on lead 32c is approximately 45 degrees.

Face 28 of capillary 20 is shown in phantom in the positions at which ball bonds and stitch bonds are sequentially formed. The area of face 28 of capillary 20 that is over bond pads 9a–9c during ball bonding is sufficient to form high quality, reliable ball bonds 7. Likewise, the area of face 28 of capillary 20 that is over leads 32a and 32b during stitch bonding is sufficient to form high quality, reliable stitch bonds. However, the area of face 28 of capillary 20 that is over lead 32c during stitch bonding is insufficient to form high quality stitch bonds. The quality of the stitch bond on lead 32c is poor enough to pose a significant reliability risk.

The high quality stitch bonds on leads 32a and 32b are due to the fact that since leads 32a and 32b are located in the y direction directly below bond pads 9a and 9b, wires 5a and 5b are substantially parallel to one another and substantially perpendicular to side 30 of die 11. As a result, during stitch bond, wires 5a and 5b extend from bore 8 and out from beneath face 28 adjacent side 25 of capillary 20. Substantially the maximum available area of face 28 is thus available to form stitch bonds on leads 32a and 32b. The poor quality stitch bond on lead 32c is due to the fact that since lead 32c is spaced in both the x and y directions from bond pad 9c, wire 5c is at an angle to wires 5a and 5b and is not perpendicular to side 30 of die 11. As a result, during stitch bond, wire 5c extends from bore 8 and out from beneath face 28 adjacent side 21 of capillary 20. Only a small area of face 28, substantially less than the maximum available area, is thus available to form a stitch bond on leads 32c.

Prior art shaved capillary bonding equipment is also incapable of bonding wires from bond pads 9a–9f to leads 32a–32f in a single operation since capillary 20 would contact previously formed ball bonds when making ball bonds on bond pads 9e–9f and the stitch bonds on leads 32d–32f would be of poor quality. In prior art shaved capillary bonding equipment, it is necessary to remove the die and leads, rotate them 90 degrees and then place them back in the bonding equipment in order to bond wires to bond pads 9d–9f and leads 32d–32f.

Figure 10:
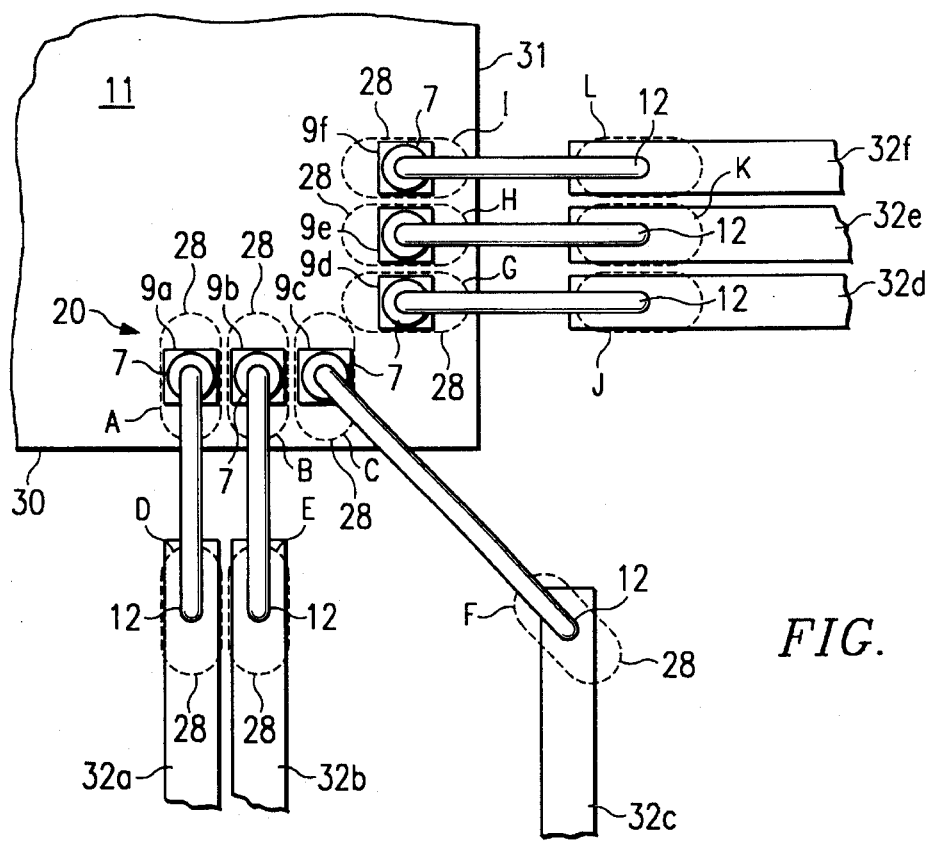
FIG. 10 shows a die wire bonded to leads using the shaved capillary of FIG. 1 in a wire bonding apparatus according to the present invention.

FIG. 10 illustrates a process for wire bonding using a shaved capillary according to the present invention that overcomes the problems resulting from the fixed orientation between the die, leads, and shaved capillary in prior art bonding equipment. The process according to the present invention is described as applied to die 11 and leads 32a–32f to form high quality ball bonds 7 on bond pads 9a–9f and high quality stitch bonds 12 on leads 32a–32f. Capillary 20 in FIG. 10 is capable of movement in the x, y, and z directions. In addition, relative rotation of capillary 20 with respect to die 11 and leads 32a–32f about the z axis perpendicular to the plane containing the x and y axes is provided by rotating either the capillary 20 or the die 11 and leads 32a–32f. The positions A, B, and C show capillary 20 in the proper orientation for ball bonding on the horizontal or x direction bond pads 9a–9c. The positions D, E, and F show capillary 20 in the proper orientation for stitch bonding on the horizontal or x direction leads 32a–32c. The positions G, H, and I show capillary 20 in the proper orientation for ball bonding on the vertical or y direction bond pads 9d–9f. The positions J, K, and L show capillary 20 in the proper orientation for stitch bonding on the vertical or y direction leads 32d–32f. For each ball bond, capillary 20 is oriented so that it does not contact a previously formed ball bond. For each stitch bond, capillary 20 is oriented so that it wire 5 extends from bore 8 and out from beneath face 28 adjacent side 25 of capillary 20.

Capillary 20 is initially at position A to form a ball bond 7 on bond Dad 9a and is moved in the y direction to position D to form a stitch bond 12 on lead 32a. Capillary 20 is then moved in the x and y directions to position B to form a ball bond 7 on bond pad 9b followed by movement in the y direction position E to form a stitch bond 12 on lead 32b. Capillary 20 is then moved in the x and y directions to position C to form a ball bond 7 on bond pad 9c followed by both movement in the x and y directions and relative rotation about the z axis between the capillary 20 and the die 11 and leads 32a–32f to position F to form a stitch bond 12 on lead 32c. Capillary 20 is then moved in the x and y directions and rotated relative to die 11 and leads 32a–32f to position G to form a ball bond 7 on bond pad 9d followed by both movement in the x direction to position J to form a stitch bond 12 on lead 32d. Capillary 20 is then moved in the x and y directions to position H to form a ball bond 7 on bond pad 9e followed by movement in the x direction position K to form a stitch bond 12 on lead 32e. Capillary 20 is then moved in the x and y directions to position I to form a ball bond 7 on bond pad 9f followed by movement in the x direction position L to form a stitch bond 12 on lead 32f.

Face 28 of capillary 20 is shown in the positions at which ball bonds and stitch bonds are sequentially formed. The area of face 28 of capillary 20 that is over bond pads 9a–9c during ball bonding is identical to that shown in FIG. 8 and is sufficient to form high quality ball bonds 7. Likewise, the area of face 28 of capillary 20 that is over leads 32a and 32b during stitch bonding is identical to that shown in FIG. 8 and is sufficient to form high quality stitch bonds. Relative rotation between the capillary 20 and the die 11 and leads 32a–32c about the z axis prior to forming the stitch bond on lead 32c insures that the area of face 28 of capillary 20 that is over lead 32c during stitch bonding is sufficient to form a high quality, reliable stitch bond. The reliability risk present using the prior art process to form stitch bonds at acute bonding angles described in FIG. 9 is thus eliminated. In addition, relative rotation between the capillary 20 and the die 11 and leads 32d–32f permits wires to be bonded to bond pads 9a–9f and leads 32a–32f in a single operation.

The high quality stitch bond on lead 32c is due to the fact that capillary 20 and die 11 leads 32a–32c have been rotated relative to one another so that wire 5c extends from bore 8 and out from beneath face 28 adjacent side 25 of capillary 20. Sufficient area of face 28 is thus available to form a stitch bond on lead 32c.

Figure 11:
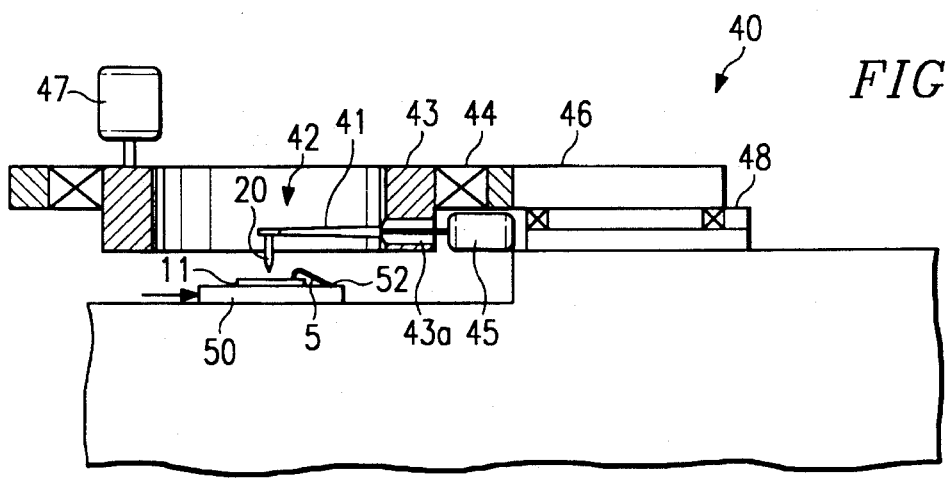
FIG. 11 is a cross-sectional view of a wire bonding apparatus according to a first embodiment of the invention.
Figure 12:
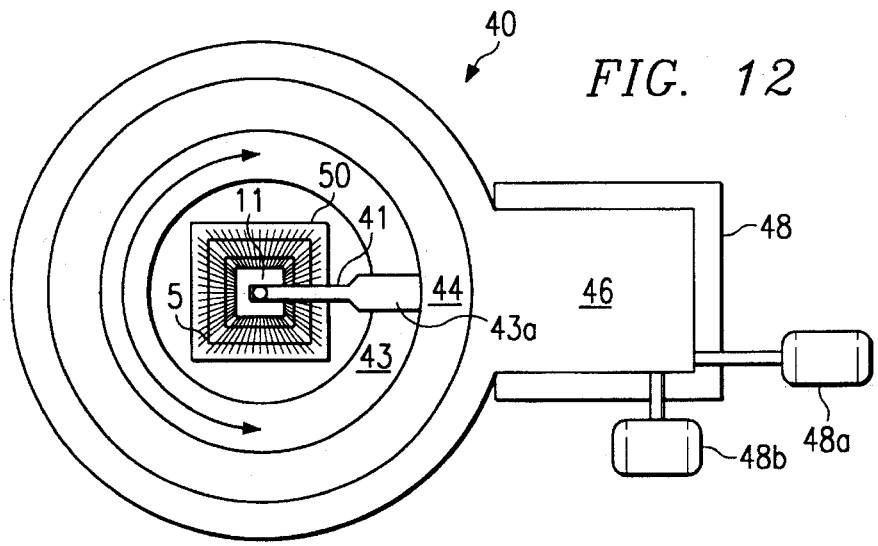
FIG. 12 is a top view of the wire bonding apparatus of FIG. 11.

FIGS. 11 and 12 illustrate a cross-section and a top view, respectively, of a first embodiment of a bonding apparatus 40 for implementing the process described in FIG. 10. Bonding apparatus 40 includes a bond head 42, a circular bond head carrier 43 having a support 43a for holding bond head 42, a bond head carrier bearing 44 on which bond head carrier 43 is mounted, a carrier bearing table 46 in which bond head carrier bearing 44 is mounted, an x-y table 48 on which carrier bearing table 46 is mounted, and a fixed work holder 50. Work holder 50 supports die 11 and a leadframe 52 between which wires 5 are bonded.

Bond head 42 includes capillary 20 and an ultrasonic horn 41 which is held by support 43a so as to be capable of movement in the z direction thus providing z-direction movement to capillary 20. Z-drive motor 45 is connected to support 43a to provide z-direction movement of capillary 20. Bond head carrier bearing 44 permits bond head carrier 43 to rotate about the z axis which in turn causes horn 41 and capillary 20 to also rotate about the z axis. Bond head carrier bearing 44 thus permits capillary 20 to be rotated about the z axis to the orientation necessary to provide high quality stitch bonds. Motor 47 is connected to bond head carrier 43 to provide rotary movement of capillary 20. Carrier bearing table 46 supports carrier bearing 44 and is moved in the x and y directions by x-y table 48. Movement of x-y table 48 thus moves capillary 20 to the desired x and y locations for bonding. X-drive motor 49a is connected to x-y table 48 to provide x-direction movement of table 48. Y-drive motor 49b is connected to x-y table 48 to provide y-direction movement of table 48. Rotation of bond head carrier 43 to rotate capillary 20 and movement of x-y table 48 may be performed manually or automatically using conventional pattern recognition techniques and computer control.

Figure 13:
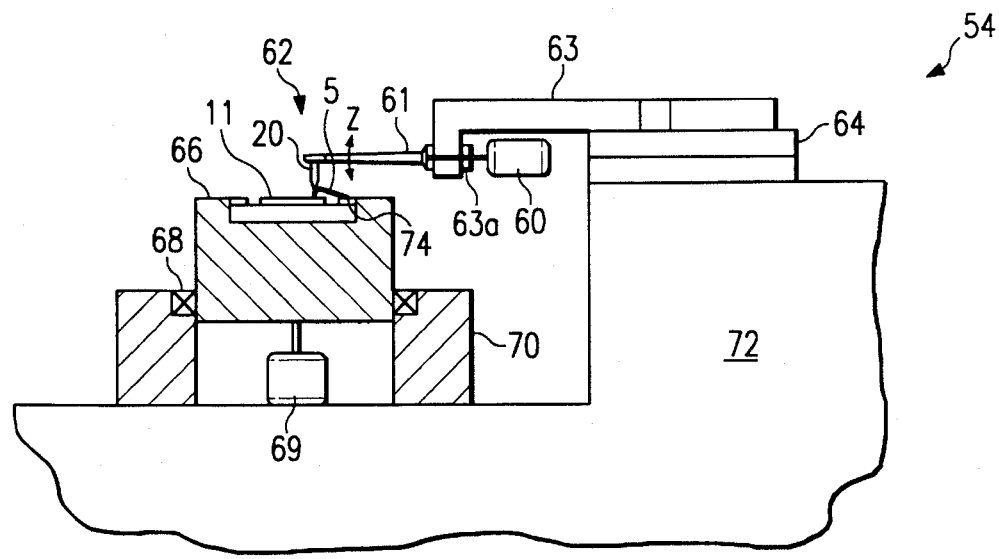
FIG. 13 is a cross-sectional view of a wire bonding apparatus according to a second embodiment of the invention.
Figure 14:
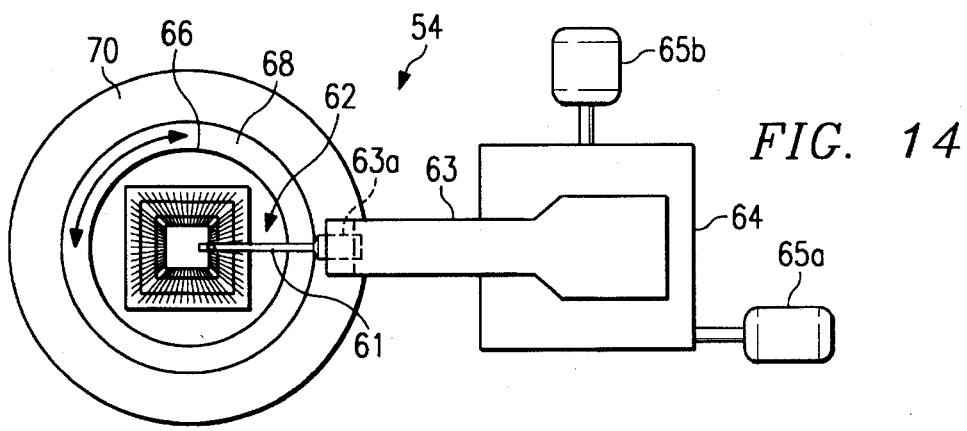
FIG. 14 is a top view of the wire bonding apparatus of FIG. 13.

FIGS. 13 and 14 illustrate a cross-section and top view, respectively, of a second embodiment of a bonding apparatus 54 for implementing the process described in FIG. 9. Bonding apparatus 54 includes a bond head 62, a bond head carrier 63 having a support 63a for holding bond head 62, an x-y table 64 on which bond head carrier 63 is mounted, a circular work holder 66, a circular work holder bearing 68 for supporting and permitting rotation of work holder 66, a support 70 in which bearing 68 is mounted, and a base 72 on which support 70 and x-y table 64 are mounted. Work holder 66 supports die 11 and a leadframe 74 between which wires 5 are bonded.

Bond head 62 includes capillary 20 and an ultrasonic horn 61 which is held by support 63a so as to be capable of movement in the z direction thus providing z-direction movement to capillary 20. Z-drive motor 60 is connected to support 63a to provide z-direction movement of capillary 20. Work holder bearing 68 permits work holder 66 to rotate about the z axis which in turn die 11 and leadframe 74 to also rotate about the z axis. Work holder bearing 68 thus permits die 11 and leadframe 74 to be rotated about the z axis to an orientation relative to the fixed orientation of capillary 20 capable of providing high quality stitch bonds. Motor 69 is connected to work holder 66 to provide rotary movement of die 11 and leadframe 74. Bond head carrier 63 supports bond head 62 and is moved in the x and y directions by x-y table 64. Movement of x-y table 64 thus moves capillary 20 to the desired x and y locations for bonding. X-drive motor 65a is connected to x-y table 64 to provide x-direction movement of table 64. Y-drive motor 65b is connected to x-y table 64 to provide y-direction movement of table 64. The rotation of work holder 66 to rotate die 11 and leadframe 74 relative to capillary 20 and the movement of x-y table 64 may be performed manually or automatically using conventional pattern recognition techniques and computer control.

A few preferred embodiments have been described in detail hereinabove. It is to be understood that the scope of the invention also comprehends embodiments different from those described, yet within the scope of the claims. For example, numerous bond pad and lead configurations other than those shown may be used. In addition, relative rotations of the capillary with respect to the die and leads other than those shown may be used to form ball and stitch bonds While this invention has been described with reference to an illustrative embodiment, this description is not intended to be construed in a limiting sense. Various modifications and combinations of the illustrative embodiment, as well as other embodiments of the invention, will be apparent to persons skilled in the art upon reference to the description. It is therefore intended that the appended claims encompass any such modifications or embodiments.

We claim:

1. A method for wire bonding using a capillary having a bore and first and second opposed side walls and third and fourth opposed side walls, said third and fourth side walls being curved and spaced apart by a longitudinal dimension along a first axis through said bore, said first and second side walls spaced apart by a lateral dimension along a second axis through said bore perpendicular to said first axis, said lateral dimension being less than said longitudinal dimension, comprising the steps of:

forming a ball bond with a first end of a wire on a first surface at a first location with said capillary;

moving said capillary to a second surface at a second location so that said wire extends from said first location to said second location;

performing relative rotation of said capillary with respect to said second surface so that said wire extends from beneath one of said third and fourth side walls;

forming a stitch bond on said second surface at said second location.

2. The method of claim 1 in which said step of performing relative rotation includes rotating said capillary while said second surface remains fixed.

3. The method of claim 1 in which said step of performing relative rotation includes rotating said second surface while said capillary remains fixed.

4. The method of claim 1 in which said first surface is a surface of a bond pad on a semiconductor die and said second surface is a surface of a lead.

5. The method of claim 1 in which said first and second opposed side walls are planar.

6. The method of claim 5 in which said first and second opposed side walls are parallel.

7. A wire bonding apparatus for forming ball bonds and stitch bonds, comprising:

a bond head including a capillary having a bore and first and second opposed side walls and third and fourth opposed side walls, said third and fourth side walls being curved and spaced apart by a longitudinal dimension along a first axis through said bore, said first and second side walls spaced apart by a lateral dimension along a second axis through said bore perpendicular to said first axis, said lateral dimension being less than said longitudinal dimension;

a work holder for supporting a semiconductor die and a leadframe adjacent said capillary;

means for providing relative rotation about a z axis between said capillary and said work holder.

8. The apparatus of claim 7 in which said first and second opposed side walls are planar.

9. The apparatus of claim 8 in which said first and second opposed side walls are parallel.

10. The apparatus of claim 7 further comprising: means for moving said capillary in x and y directions.

11. The apparatus of claim 10 in which said means for moving said capillary in x and y directions includes:

a carrier for holding said bond head;

an x-y table on which said carrier is mounted.

12. The apparatus of claim 7 in which said means for providing relative rotation about a z axis between said capillary and said work holder includes:

a carrier for holding said bond head;

a bearing on which said carrier is mounted;

a bearing table on which said bearing is mounted, said bearing table and bearing providing rotary movement about a z axis for said carrier.

13. The apparatus of claim 7 in which said means for providing relative rotation about a z axis between said capillary and said work holder includes:

a bearing mounted in a support, said bearing supporting and permitting rotation about a z axis of said work holder.

14. A wire bonding apparatus for forming ball bonds and stitch bonds, comprising:

a bond head including a capillary having a bore and first and second opposed side walls and third and fourth opposed side walls, said third and fourth side walls being curved and spaced apart by a longitudinal dimension along a first axis through said bore, said first and second side walls spaced apart by a lateral dimension along a second axis through said bore perpendicular to said first axis, said lateral dimension being less than said longitudinal dimension;

a carrier for holding said bond head;

a bearing on which said carrier is mounted;

a bearing table on which said bearing is mounted, said bearing table and bearing providing rotary movement about a z axis for said capillary;

an x-y table on which said carrier bearing table is mounted, said x-y table providing movement in x and y directions for said capillary;

a fixed work holder for supporting a semiconductor die and a leadframe adjacent said capillary.

15. The apparatus of claim 14 in which said first and second opposed side walls are planar.

16. The apparatus of claim 15 in which said first and second opposed side walls are parallel.

17. A wire bonding apparatus for forming ball bonds and stitch bonds, comprising:

a bond head including a capillary having a bore and first and second opposed side walls and third and fourth opposed side walls, said third and fourth side walls being curved and spaced apart by a longitudinal dimension along a first axis through said bore, said first and second side walls spaced apart by a lateral dimension along a second axis through said bore perpendicular to said first axis, said lateral dimension being less than said longitudinal dimension;

a carrier for holding said bond head;

an x-y table on which said carrier is mounted, said x-y table providing movement in x and y directions for said capillary;

a work holder for holding a semiconductor die and a leadframe adjacent said capillary;

a bearing mounted in a support, said bearing supporting and permitting rotation about a z axis of said work holder to rotate said semiconductor die and leadframe relative to said capillary.

18. The apparatus of claim 17 in which said first and second opposed side walls are planar.

19. The apparatus of claim 18 in which said first and second opposed side walls are parallel.

* * * * *